United States Patent [19]
Hirosawa

[11] Patent Number: 5,766,674
[45] Date of Patent: Jun. 16, 1998

[54] METHOD OF PRODUCING A PRINTED WIRING BOARD

[75] Inventor: Koichi Hirosawa, Tokyo, Japan

[73] Assignee: NEC Corporation, Japan

[21] Appl. No.: 604,218

[22] Filed: Feb. 20, 1996

[30] Foreign Application Priority Data

Feb. 21, 1995 [JP] Japan ................... 7-032169

[51] Int. Cl.[6] ........................... B05D 5/12
[52] U.S. Cl. ............... 427/96; 427/98; 427/307; 427/372.2; 427/510; 228/180.21; 228/215
[58] Field of Search .................. 427/96, 98, 312, 427/313, 307, 372.2, 405, 510; 228/180.21, 180.22, 215; 430/311, 313

[56] References Cited

U.S. PATENT DOCUMENTS 5,464,662  11/1995  Murakami et al. .............. 427/510

FOREIGN PATENT DOCUMENTS

| 64-64292 | 3/1989 | Japan | H05K 3/28 |
| 4181795 | 6/1992 | Japan | H05K 3/24 |
| 4359590 | 12/1992 | Japan | H05K 3/28 |

Primary Examiner—Shrive P. Beck
Assistant Examiner—Brian K. Talbot
Attorney, Agent, or Firm—Hayes, Soloway, Hennessey, Grossman & Hage, P.C.

[57] ABSTRACT

In a method of producing a printed wiring board, solder layers are formed on pads beforehand. After the solder layers have been covered with a solder resist, the solder layers are caused to flow so as to render only the portion of the solder resist overlying the pads fragile. Then, the fragile portions of the solder resist are removed by roughening with the result that solder resist dams for preventing the solder from flowing are formed. This kind of procedure allows thick solder layers to be formed simultaneously with the solder resist dams without resorting to a great number of steps or an extra mask.

6 Claims, 2 Drawing Sheets

5,766,674

METHOD OF PRODUCING A PRINTED WIRING BOARD

BACKGROUND OF THE INVENTION

The present invention relates to a method of producing a printed wiring board (PWB) and, more particularly, to a method of producing a PWB for surface mount type electronic parts.

Methods for the production of PWBs are taught in, e.g., Japanese Patent Laid-Open Publication Nos. 4-181795 (Prior Art 1), 64-64292 (Prior Art 2), and 4-359590 (Prior Art 3).

It has been customary with a PWB to feed a solder to pads by using solder balls. This method, however, requires solder balls to be adhered to the pads one by one with accuracy, and requires the size of the balls to be changed on the basis of the size of the pads. For this reason, the solder ball scheme is not practiced with PWBs, except for some special methods. Prior Art 1 solves this problem with the following procedure. First, the entire PWB, including the pads, is plated to become conductive. A resist film open in its portions corresponding to the pads is formed on the conductive plating by a photoresist. Subsequently, electricity is applied to any portion of the entirely conductive PWB so as to form a thick solder layer on the exposed pads by electric plating. After the photoresist has been removed, the plating is etched by an etching liquid, but the solder is not etched. As a result, a desired solder layer is formed on the pads.

Prior Art 2 and Prior Art 3 each discloses a method of forming a solder resist layer around pads with accuracy. In Prior Art 3 which is most popular, a photosensitive solder resist is applied to the entire surface of a PWB. After a mask has been positioned on the solder resist, the resist is exposed and then developed by trichloroethane or sodium carbonate to turn out a solder resist layer. This method, however, needs highly accurate positioning of the mask or film and is not practicable with, e.g., quad flat packages (QFPs) having a pitch of 0.4 mm. By contrast, Prior Art 2 applies resist ink to the entire surface of a PWB, grinds the ink until circuitry and pads show themselves, and again covers the circuitry by printing. As a result, only the pads appear on the surface of the PWB.

Further, Prior Art 3 teaches the following method.

First, highly sensitive ink is applied to the entire surface of a PWB. Then, the PWB, including pads, is exposed via a film which covers the entire portions surrounding the pads. At this instant, light turns round to between the pads at the rear from portions other than the pads due to the light transmitted through and diffused in the substrate, thereby exposing the solder resist. This is also followed by development. Because the highly sensitive resist ink allows a solder resist to be formed by the diffused light in the substrate, light does not reach the rear of the portions where copper circuitry including the pads is present. This prevents the solder resist from covering the pads (the circuitry has been formed by exposure from the front).

Prior Art 1 to Prior Art 3 described above each has some problems left unsolved, as follows.

Prior Art 1 is capable of increasing the thickness of the solder by increasing the plating time or the current density, i.e., by causing much of the plating to precipitate. However, assume that the solder should be applied in an amount matching the surface area of a pad, but greater than the maximum amount which stabilizes the solder on the basis of surface tension (maximum thickness of about 20 μm in the case of an eutectic solder). Then, a great amount of solder flows out, compared to the surface tension, during the heating which follows plating. As a result, the solder flows out in the form of solder balls. If the plated PWB is not subjected to heating, lead and tin cannot be sufficiently alloyed with the result that the soldering ability is deteriorated due to the oxidation of tin. Of course, to adhere the solder balls, it is necessary to repeat the adhering and heating steps several times in order to change the amount of solder for every pad. This is not only time-consuming, but also causes the balls to simply flow out if the size of the balls is increased.

Prior Art 2 applies the ink to the entire PWB, and grinds it to cause the pads to appear. However, because the surface of the PWB has complex undulations, grinding the entire PWB surface so as to produce the distributed pads is difficult in practice and is, if not impossible, time- and cost-consuming. The cost is further increased when the application is repeated twice. Prior Art 3 is capable of forming a resist with accuracy (i.e. without any clearance) by using the diffusion of light into the substrate (so-called halation). However, the diffused light prevents a resist higher than the pads from being formed; such resist would cover the entire pads. In addition, the resist cannot be formed when the PWB substrate is made of polyimide or similar substance which is scarcely transmissive to light.

SUMMARY OF THE INVENTION

It is therefore an object of the present invention to provide a method of producing a PWB capable of feeding a sufficient amount of solder onto pads easily and rapidly without causing the solder to flow out or deteriorating the soldering ability.

In accordance with the present invention, a method of producing a PWB has the steps of forming a conductive metal layer including pads on the surface of a substrate, forming on preselected ones of the pads surface metal layers lower in melting point than the conductive metal layer, applying a resin to the surface of the substrate to thereby cover the surface metal layers with a resin layer, heating the substrate at a temperature lower than the melting point of the conductive metal layer, but higher than the melting point of the surface metal layers, to thereby fuse the surface metal layers, removing the resin layer from the surface metal layers by chemical roughening and rinsing, and immersing the substrate in a fused solder to thereby form a solder on the surface metal layers.

Also, in accordance with the present invention, a method of producing a PWB has the steps of forming a conductive metal layer including pads on the surface of a substrate, forming on preselected ones of the pads surface metal layers lower in melting point than the conductive metal layer, applying a photosensitive resin to the surface of the substrate to thereby cover the surface metal layers, causing portions of the photosensitive resin above the surface metal layers to be hardened by light transmitted through and diffused in the substrate to thereby form a resin layer, heating the substrate at a temperature lower than the melting point of the conductive metal layer, but higher than the melting point of the surface metal layers, to thereby fuse the surface metal layers, removing the resin layer from the surface metal layers by chemical roughening and rinsing, and immersing the substrate in a fused solder to thereby form a solder on the surface metal layers.

BRIEF DESCRIPTION OF THE DRAWINGS

The above and other objects, features and advantages of the present invention will become more apparent from the following detailed description taken with the accompanying drawings in which.

DESCRIPTION OF THE PREFERRED EMBODIMENTS

Figure 1A:
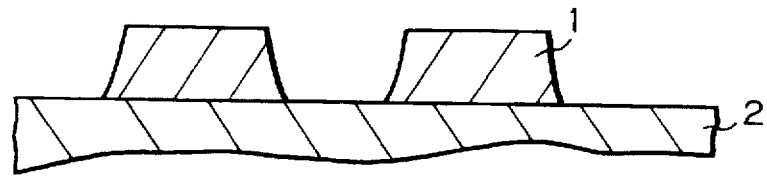
FIGS. 1A, 1B, 1C, 1D, 1E and 1F are fragmentary sections demonstrating a method of producing a PWB and embodying the present invention.
Figure 1B:
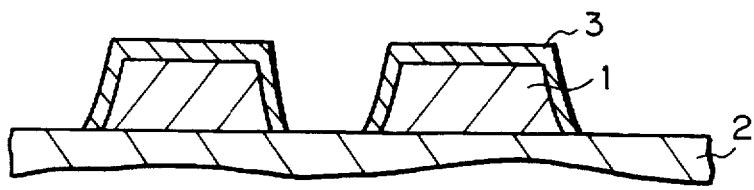

Referring to FIGS. 1A–1F, a method of producing a PWB and embodying the present invention will be described. First, as shown in FIG. 1A, pads 1 are formed on a substrate 2 by etching on the basis of a conventional subtractive method. Each pad 1 is 35 mµ thick and 150 µm wide and spaced 150 µm from nearby pads 1. Subsequently, as shown in FIG. 1B, solder layers 3 are formed on the pads 1 by the electrolytic or nonelectrolytic plating of a solder. In the illustrative embodiment, use is made of a eutectic solder having a typical composition listed in Table 1 below.

TABLE 1

| Substance | Chemical Formula | Concentration |
| --- | --- | --- |
| Thiourea | Cs(NH$_2$)$_2$ | 100 g/L |
| Stannas Chloride | SnCl$_2$2H$_2$O | 15 g/L |
| Lead Acetate | Pb((H$_3$COO)$_2$)3H$_2$O | 10 ~ 15 g/L |
| Hydrochloric Acid | HCl | 30 cc/L |
| Additive | — | trace |

Specifically, before plating, the substrate 2 with the pads 1 is slowly agitated in order to remove grease (alkali type) or to effect soft etching (ammonium persulfate) as preprocessing. Then, plating is executed for 15 minutes at 60° C. to 80° C. The substrate 2 provided with the solder layers 3 may be rinsed, as needed.

Figure 1C:
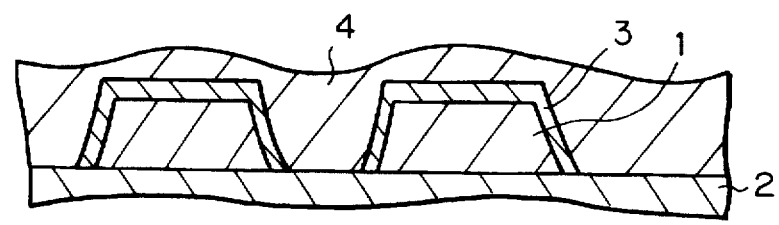

As shown in FIG. 1C, a solder resist 4 is applied to the substrate 2 over the solder layers 3 covering the pads. For solder resist ink, use was made of PSR-4000 (trade name) available from Taiyo Ink K.K.. The solder resist 4 was applied to the substrate 2 to a thickness of 45 µm by screen printing. This is followed by hot air drying effected for 15 minutes at 80° C. Although the surface of the solder resist layer is irregular, it does not matter at all. A curtain coater, roller coater or similar coater may be used for the application of the solder resist 4. However, the prerequisite is that the solder resist 4 be not thicker than the plating 3 at positions above the pads 1. Thick solder resist 4 would increase the heating time and roughening time which will be described. Subsequently, the solder resist 4 is illuminated by an ultraviolet lamp via a film so as to be removed from ordinary lands, pads not used, and so forth. The resulting pattern on the substrate 2 is developed by sodium carbonate. At this instant, all the pads to be used are exposed such that the solder resist 4 remain thereon.

Figure 1D:
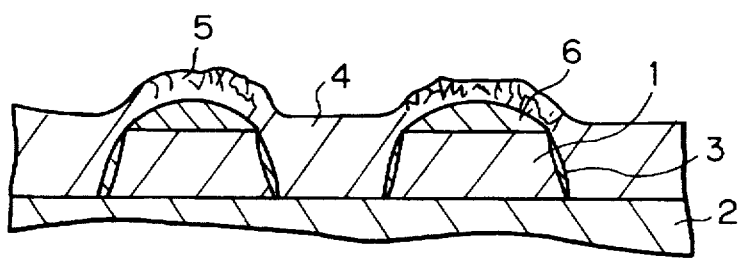

Thereafter, as shown in FIG. 1D, the solder layers 3 are fused in order to insure the alloying of the solder. In this embodiment, the above assembly was immersed in water-soluble oil and heated for 60 seconds at 150° C. (preprocessing), and then heated for 10 seconds at 240° C. (processing). Then, the assembly was rinsed by hot water for 30 seconds at 80° C. to 90° C., rinsed by water for 2 minutes, and then rinsed by flowing water. At this instant, the solder layers 3 are fused to turn out fused solder layers 6. As a result, the solder resist 4 collapses to turn out collapsed solder resist 5. Because this part of the solder resist 4 is fragile and apt to come off during, e.g., ringing, care must be taken in the case of quantity production.

Figure 1E:
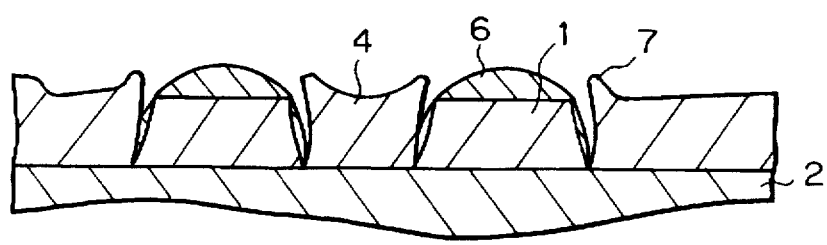

As shown in FIG. 1E, the above assembly is subjected to roughening under conditions listed in Table 2 below.

TABLE 2

| Bath | Major Component | Concentration |
| --- | --- | --- |
| Swelling Liquid | ethylene glycol monobutyl ether | 0.8% (weight) |
| | NaOH | alkali :0.8 normality |
| Roughening Liquid | KMnO$_4$ | 40 g/L |
| | NaOH | alkali :1.0 normality |
| Neutralizing & Reducing Liquid | H$_2$SO$_4$ | 6% (weight) |
| | hydroxyamine sulfate | 2% (weight) |

Figure 1F:
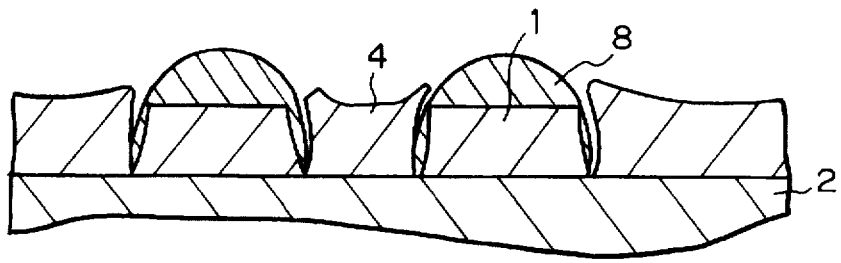

As shown in FIG. 1E, the collapsed solder resist 5 is removed by the roughening step with the result that solder resist dams 7 are formed. The condition shown in FIG. 1E suffices if the solder layers 3 are sufficiently thick. Assume that the solder layers 3 are not sufficiently thick. Then, as shown in FIG. 1F, a solder is added to the solder layers 3 by solder coating, solder printing or similar technology and by using the solder resist dams 7. In this embodiment, a dispenser was used to add a solder paste to the solder layers 3. Consequently, solder layers 8 were formed each of which was 42.3 µm high on average, as measured at the center of each pad 1.

Figure 2A:
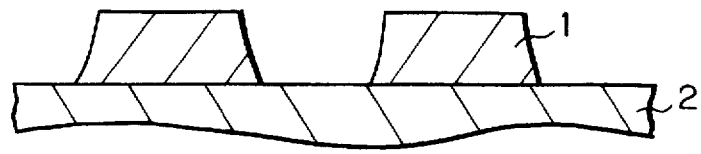
FIGS. 2A, 2B, 2C, 2D, 2E, 2F, and 2G are fragmentary views showing an alternative embodiment of the present invention.
Figure 2B:
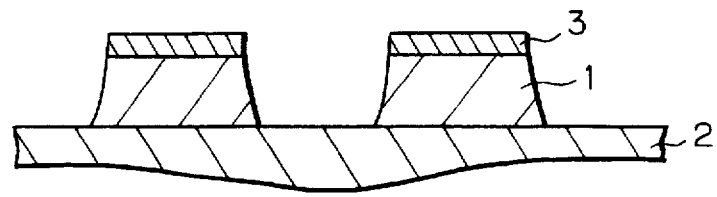
Figure 2C:
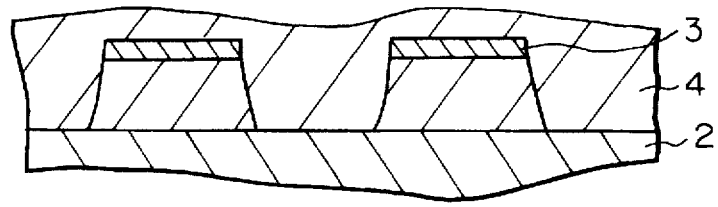

FIGS. 2A–2G show an alternative embodiment of the present invention. First, as shown in FIG. 2A, the pads 1 are formed on the substrate 2 by etching on the basis of a conventional subtractive method. Each pad 1 is 35 mµ thick and 150 µm wide and spaced 150 µm from nearby pads 1. Subsequently, as shown in FIG. 2B, the solder layers 3 each being about 10 µm thick are formed on the pads 1 by screen printing or similar conventional technology by use of a solder paste. In the illustrative embodiment, use was made of an eutectic solder paste having a solder concentration of 60% by weight. Then, as shown in FIG. 2C, the solder resist 4 is applied to the substrate 2 over the solder layers 3. For solder resist ink, use was made of a resist which noticeably enhances photosensitivity and is sensitive even to a diffused reflection into the substrate 2. The solder resist 4 was applied to the substrate 2 to a thickness of 45 µm by screen printing. This is followed by hot air drying effected for 15 minutes at 80° C. Although the surface of the solder resist layer is irregular, it does not matter at all. A curtain coater, roller coater or similar coater may be used for the application of the solder resist 4. However, the prerequisite is that the solder resist 4 be not thicker than the plating 3 at positions above the pads 1. Thick solder resist 4 would increase the heating time and roughening time.

Figure 2D:
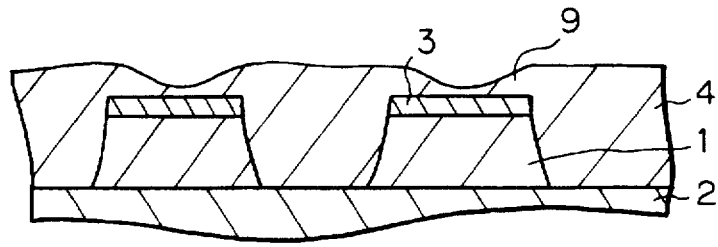

Subsequently, as shown in FIG. 2D, the solder resist 4 is illuminated by an ultraviolet lamp via a film so as to be removed from ordinary lands, pads not used, and so forth. The resulting pattern on the substrate 2 is developed by sodium carbonate. At this instant, the pads 1 are entirely masked such that the portions of the solder resist 4 above the pads I are exposed by the reflected and diffused light. In this condition, the solder resist 4 remains on the pads 1 due to the reflected and diffused light in the substrate 2, as at 9.

Figure 2E:
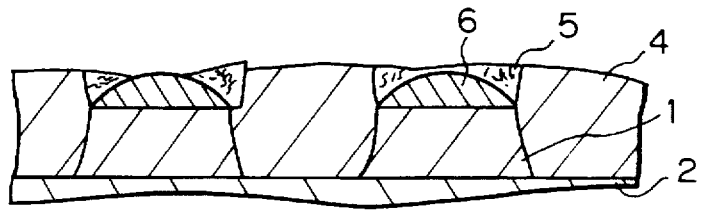

Thereafter, as shown in FIG. 2E, the solder layers 3 are fused in order to insure the alloying of the solder. Again, the above assembly was immersed in water-soluble oil and heated for 60 seconds at 150° C. (preprocessing), and then heated for 10 seconds at 240° C. (processing). Then, the assembly was rinsed by hot water for 30 seconds at 80° C. to 90° C., rinsed by water for 2 minutes, and then rinsed by flowing water. At this instant, the solder layers 3 are fused to turn out the fused solder layers 6. As a result, the solder resist 4 collapses to turn out the collapsed solder resist 5. Because this part of the solder resist 4 is fragile and apt to come off during, e.g., ringing, care must be taken in the case of quantity production.

Figure 2F:
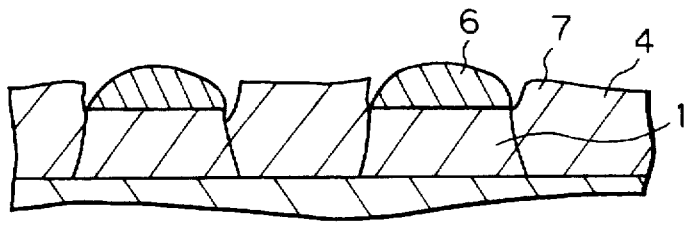
Figure 2G:
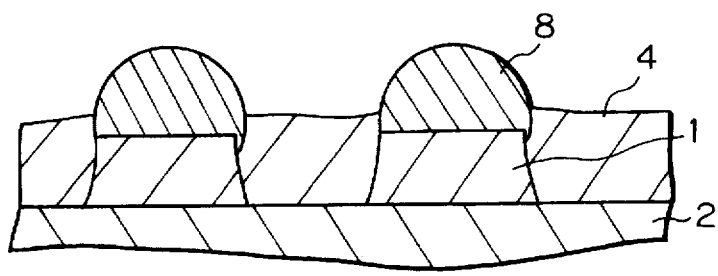

As shown in FIG. 2F, the above assembly is subjected to roughening under conditions also listed in Table 2. The collapsed solder resist S is removed by the roughening step with the result that the solder resist dams 7 are formed. The condition shown in FIG. 2F suffices if the solder layers 3 are sufficiently thick. Assume that the solder layers 3 are not sufficiently thick. Then, as shown in FIG. 2G, a solder is added to the solder layers 3 by solder coating, solder printing or similar technology and by using the solder resist dams 7. In this embodiment, a dispenser was also used to add a solder paste to the solder layers 3. As a result, the solder layers 8 were formed each of which was 60.9 μm high, as measured at the center of each pad 1. Because the solder layers 3 are not applied to the sides of the pads 1, the amount of solder can be accurately controlled, particularly when it is great.

In summary, in accordance with the present invention, solder layers are formed on pads beforehand. After the solder layers have been covered with a solder resist, the solder layers are caused to flow so as to render only the portion of the solder resist overlying the pads fragile. Then, the fragile portions of the solder resist are removed by roughening with the result that solder resist dams for preventing the solder from flowing are formed. This kind of procedure allows thick solder layers to be formed simultaneously with the solder resist dams without resorting to a great number of steps or an extra mask.

Various modifications will become possible for those skilled in the art after receiving the teachings of the present disclosure without departing from the scope thereof.

What is claimed is:

1. A method of producing a printed wiring board, comprising the steps in sequence of:

(a) forming pads of conductive meal on a surface of a substrate;

(b) forming on preselected ones of said pads surface metal layers lower in melting point than said conductive metal;

(c) applying a resin to said surface of said substrate to thereby cover said surface metal layers with a resin layer;

(d) heating said substrate at a temperature lower than the melting point of said conductive metal, but higher than the melting point of said surface metal layers, to thereby fuse said surface metal layers and render removable a portion of a solder resist formed over the pads;

(e) removing said resin layer above said preselected pads by chemical roughening and rinsing; and (f) immersing said substrate in a fused solder to thereby form a solder on said surface metal layers;

wherein said steps (a) through (f) are performed with no intermediate etching step.

2. A method as claimed in claim 1, wherein said surface metal layers comprise an eutectic solder.

3. A method as claimed in claim 1, wherein said step (e) comprises executing said chemical roughening using oxidizing agents, said oxidizing agents include a solution of potassium permanganate and sodium hydroxide.

4. A method of producing a printed wiring board, comprising the steps in sequence of:

(a) forming pads of conductive metal on a surface of a substrate;

(b) forming on preselected ones of said pads surface metal layers lower in melting point than said conductive metal;

(c) applying a photosensitive resin to said surface of said substrate to thereby cover said surface metal layers;

(d) causing portions of said photosensitive resin above said surface metal layers to be hardened by light transmitted through said diffused in said substrate to thereby form a resin layer;

(e) heating said substrate at a temperature lower than the melting point of said conductive metal, but higher than the melting point of said surface metal layers, to thereby fuse said surface metal layers;

(f) removing said photosensitive resin layer from said surface metal layers by chemical roughening and rinsing; and (g) immersing said substrate in a fused solder to thereby form a solder on said surface metal layers, wherein said steps (a) through (g) are performed with no intermediate etching step.

5. A method as claimed in claim 4 wherein said surface metal layers comprise an eutectic solder.

6. A method as claimed in claim 4, wherein said step (e) comprises executing said chemical roughening using oxidizing agents, said oxidizing agents include a solution of potassium permanganate and sodium hydroxide.

* * * * *

UNITED STATES PATENT AND TRADEMARK OFFICE
CERTIFICATE OF CORRECTION

PATENT NO. : 5,766,674
DATED : June 16, 1998
INVENTOR(S) : Koichi Hirosawa

It is certified that error appears in the above-identified patent and that said Letters Patent is hereby corrected as shown below:

Claim 1, Col. 5, line 46 "meal" should be --metal--.

Claim 4, Col. 6, line 32, "said" should be --and--.

Claim 6, Col. 6, line 48, "(e)" should be --(f)--.

Signed and Sealed this

Twenty-seventh Day of October, 1998

Attest:

BRUCE LEHMAN

Attesting Officer  Commissioner of Patents and Trademarks